United States Patent [19]
Weir et al.

[11] Patent Number: 5,532,601
[45] Date of Patent: Jul. 2, 1996

[54] CIRCUIT INTEGRITY TEST SYSTEM

[75] Inventors: Michael P. Weir, Ballston Lake; Hunt A. Sutherland, Saratoga Springs, both of N.Y.

[73] Assignee: General Electirc Company, Schenectady, N.Y.

[21] Appl. No.: 388,917

[22] Filed: Feb. 15, 1995

[51] Int. Cl.$^6$ ................................................. G01R 31/02
[52] U.S. Cl. ...................... 324/539; 324/522; 324/525; 340/650
[58] Field of Search ..................... 324/522, 537, 324/543, 713, 715, 525, 509–511, 539; 340/649, 650, 652, 660–664

[56] References Cited

U.S. PATENT DOCUMENTS

| | | | |
|---|---|---|---|
| 4,313,169 | 1/1982 | Takagi et al. | 324/525 X |
| 4,335,348 | 6/1982 | Reed et al. | 324/539 X |
| 4,728,898 | 3/1988 | Staley, Jr. | 324/522 |
| 5,345,180 | 9/1994 | Maier et al. | 324/511 X |

Primary Examiner—Kenneth A. Wieder
Assistant Examiner—Diep Do
Attorney, Agent, or Firm—Lawrence P. Zale; Marvin Snyder

[57] ABSTRACT

A system for testing the integrity of critical circuitry, lines and wires employs a differential amplifier having an input resistance $R_{in}$ and a feedback loop with a resistance $R_{fb}$. The critical wires being tested must be a signal wire series connected to a resistance $R_s$, which is in turn series connected to a return wire. A test voltage source is connected to the noninverting input of the differential amplifier. The signal wire is connected to the inverting input of the differential amplifier. The test voltage source is activated by a test control unit. When activated, the test voltage source provides two distinct outputs allowing computation of a test gain in the presence of other functional signals. The test control unit measures the output $V_{out}$ of the differential amplifier and computes the value of the test gain. A break in either the signal wire or the return wire will result in a test gain of 1. If the signal and return wires are shorted, the test gain will be $1+R_{fb}/R_{in}$. If the wires are undamaged, the test gain will be $1+R_{fb}/(R_{in}+R_s)$. The test control unit then activates an appropriate output device in the event of a fault. In an alternate embodiment, a second amplifier is employed to synthesize a second signal which is subtracted out of the $V_{out}$ signal to remove the effects on the signal introduced from testing.

6 Claims, 3 Drawing Sheets

CIRCUIT INTEGRITY TEST SYSTEM

CROSS REFERENCES TO RELATED APPLICATIONS

This application is related to U.S. patent application "Method For In-Place Circuit Integrity Testing" Ser. No. 08/388,914 filed Feb. 15, 1995, pending by M. Weir, H. Sutherland filed herewith, assigned to the present assignee and hereby incorporated by reference.

BACKGROUND OF THE INVENTION

1. Field of the Invention

The present invention relates to a system for testing the integrity of electric wiring.

2. Discussion of Prior Art

The wiring within electronic systems may burn through or break, becoming an 'open circuit', or may burn through electrical insulating material to come in contact with other conducting electrical elements causing a short circuit.

Many times it is impossible to detect open or short circuits by monitoring a signal of the wiring. This occurs in systems where a '0' voltage level is a valid signal, but also occurs during an open circuit. Similarly, a short circuit may exhibit a voltage which is also a valid signal value.

A wire may be tested for continuity by connecting one end to a current or voltage source, connecting the other end to a known load or measurement device, and observing the value of current that flows or the voltage that appears at the load. Such tests may be done periodically or when an open circuit is suspected. These tests may be done manually, or by dedicated automatic circuitry. They may be performed in sections to isolate faulty segments. The key drawback of such tests is that they require interrupting the normal signal path, so that for the duration of the test, the desired signal is not transmitted.

A similar method may be employed to test for short circuits, by driving a wire with a known signal. A short circuit may be deduced by the presence of a response signal on a wire which is not being driven. A short circuit may also be indirectly deduced from an incorrect response signal of the driven wire. Again, the difficulty is the disturbance of the signal path for the duration of the tests.

Determining open and short circuits through manual means becomes very difficult or impossible in remote or hazardous environments such as on satellites, aircraft guidance systems, in nuclear reactor cores, deep within drilling wells, in constricted or hidden enclosures. Automation of the above described tests requires the addition of circuitry with attendant increase in failure rate, cost, power dissipation, and size.

Also, without testing, the system may be operated with defective wiring, leading to false conclusions and undetected hazards.

Some wiring in an electronic system is more sensitive than others. A short or open circuit of wiring used in sensing the operation of a large current consuming device, such as a motor, causes a controller to receive incorrect information about the status of the system. This causes the controller to overlook an overload situation causing damage to system components. This may occur even if protected by circuit breakers if they do not cut the power quickly enough, or if the faulty wiring is associated with operation of the circuit breaker.

Currently there is a need for wire test system which automatically determines the integrity of electrical wiring.

SUMMARY OF THE INVENTION

A in-place test device tests the integrity of a peripheral branch having a signal wire and return wire connecting a source with a known resistance $R_s$ coupled to an input circuit having a differential receiving amplifier with an input resistance $R_{in}$ and a feedback resistance $R_{fb}$. The differential amplifier provides an output voltage $V_{out}$ linearly related to voltage provided to its inputs.

A test voltage unit is connected between the differential amplifier's noninverting input and the return line. It is capable of providing two different voltages upon command.

A test control unit activates the test voltage unit to produce a first test value $V_{test1}$. The output $V_{out1}$ of the amplifier is measured. Test control unit then activates the test voltage unit to produce a second test value $V_{test2}$, and measure the output $V_{out2}$ of the amplifier. A "testgain" being the change in the amplifier's output voltage divided by the change in the test voltage unit output is then determined. A break in either the signal wire or the return wire will result in a testgain of 1. If the signal and return wires are shorted together, the testgain will be $1+R_{fb}/R_{in}$. If there are no wire faults, the testgain will be $1+R_{fb}/(R_{in}+R_s)$. The test control unit is capable of activating an appropriate output device if shorted or open wires are detected.

In an alternate embodiment, a second amplifier is employed to synthesize a second signal which is subtracted out of the $V_{out}$ signal to remove the effects on the signal introduced during testing.

In another alternate embodiment, a very accurate test voltage unit is employed. The test control unit is not required to measure the output of the test voltage unit, but employs an expected value in the computation of the testgain.

OBJECTS OF THE INVENTION

An object of the present invention is to provide a wire test system which automatically determines open and short circuits.

Another object of the present invention is to provide a wire test system which does not require reconnection of the signal wires each time the wires are checked.

Another object of the present invention is to provide a device for testing wires of a circuit, as the circuit is operating.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description taken in conjunction with the drawings, in which:

DETAILED DESCRIPTION OF THE INVENTION

Figure 1:
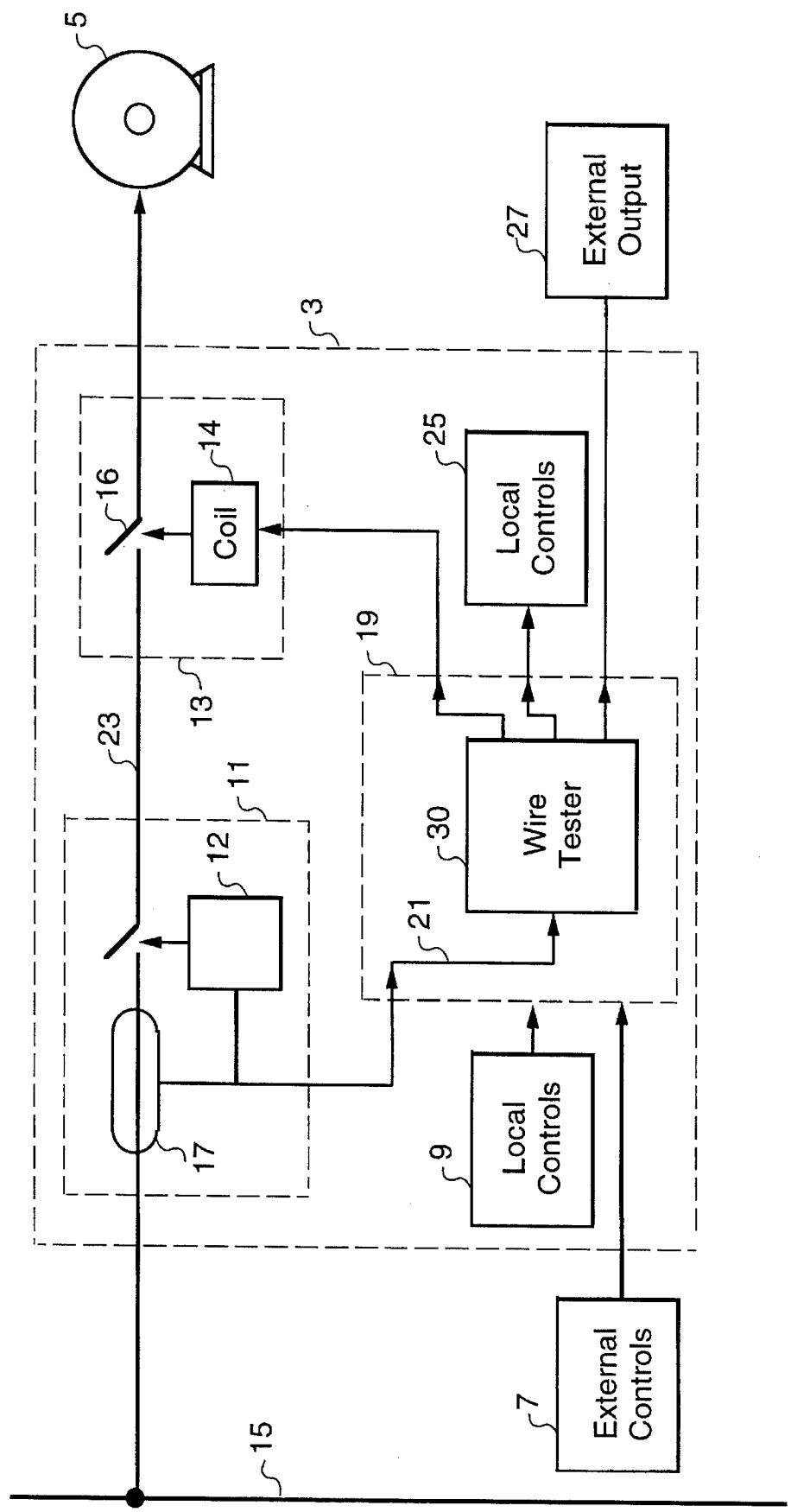
FIG. 1 is a simplified block diagram of the present invention employed in a 'motor starter'.

In FIG. 1, the present invention is shown in a simplified block diagram, employed in a 'motor starter' 3. Motor starter 3 is a circuit which selectively provides power from a supply line 15 to a large electric motor 5. A circuit breaker 11, employing a current sensor 17 monitors currents passing through power line 23. A circuit breaker typically is required to provide protection of the wiring and facilities from damage resulting from short circuits in the wiring. They operate by opening contacts through which the current is flowing. It may also offer a degree of protection from motor overloads and faults.

Motor starter 3 frequently employs a separate means of protecting the motor against overloads. In FIG. 1, this protection is provided by a control module ("CM") 19 which utilizes the signals from current sensor 17 to determine if the relay 13 (typically known as a "contactor") should be opened to protect motor 5.

The signals from current sensor 17 are transmitted by line 21 to CM 19 which controls a coil 14 of contactor 13 to close a switch 16 connecting line 15 and motor 5. An external control 7 and local control 9 may also cause the CM 19 to open the circuit. CM 19 may also provide status indications to local output 25 and external output 27.

Figure 2:
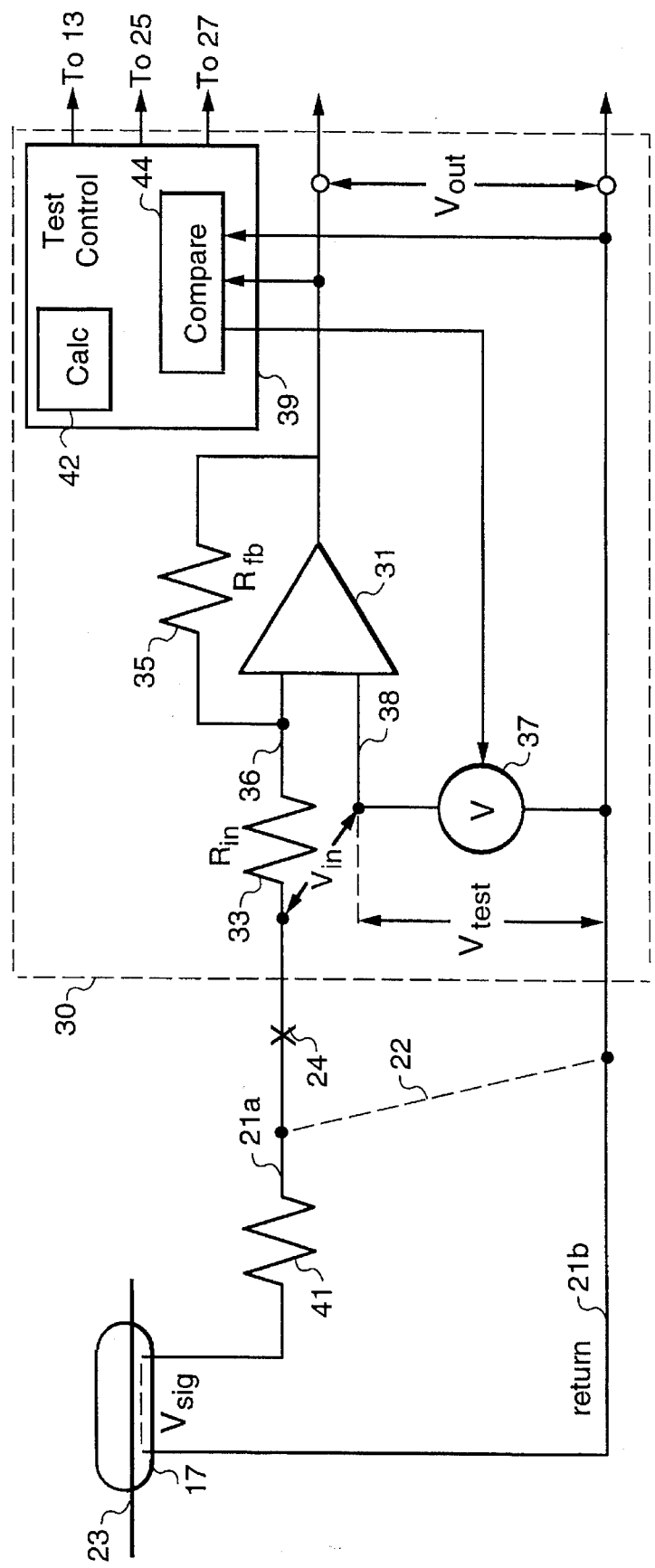
FIG. 2 is a more detailed block diagram of a first embodiment of a wire tester circuit according to the present invention.

In FIG. 2, a more detailed block diagram of CM 19 of FIG. 1. Current sensor 17 monitors current passing through a motor power wire 23 to motor 5, and produces a signal $V_{sig}$ related to the current. Signal $V_{sig}$ is passed through sensor wires 21a, 21b to CM 19. CM 19 relies on $V_{sig}$ to determine if motor 5 is consuming the proper amount of current, and the accumulated workload of motor 5. If current sensor 17 or sensor wires 21a, 21b are malfunctioning, CM 19 does not receive an accurate representation of current being consumed by motor 5. A broken sensor wire 21a or 21b, or a short between them, causes a voltage $V_{sig}=0$, which is also the same as when the motor has been turned off, or is being driven by its load, with a correctly functioning system. Therefore $V_{sig}=0$ is a valid signal and will not indicate a problem with the system. CM 19 cannot use a zero voltage value as an indicator of a problem, and will therefore be ineffective at protecting motor 5 in this situation. Motor 5 may be damaged if it is overloaded, or suffers a fault, while wires 21a and 21b are open or shorted.

In order to prevent the situation described above, CM 19 is augmented with a test control unit 39 and a test voltage source 37. The combination will be subsequently referred to as a "wire tester", 30. Wire tester 30 functions to automatically test and determine open or shorts in critical wires, such as sensor wires 21a, 21b, in this example.

It should be noted that amplifier 31 and associated resistors may already be part of a basic control module, such as an input circuit.

Many conventional systems employ a receiving circuit having a differential input operational amplifier with an input resistance and feedback loop. A single ended signal typically is applied to one of the inputs of the op amp with the other input being connected to a reference, usually ground. This configuration provides a linear voltage gain of:

$$\Delta V_{out} = -R_{fb}/R_{in} * \Delta V_{in}$$

where $\Delta V_{in}$ is a change in voltage applied to the inputs.

FIG. 2 shows a circuit as described above, where operational amplifier 31 is configured with an input resistance of $R_{in}$, and a feedback loop of resistance $R_{fb}$, resistance 33, 35, respectively.

The signal $V_{sig}$ is provided through wire 21a to an inverting input 36. An input resistance $R_s$, which may be inherent in a peripheral branch comprised of line 21a, sensor 17 and return line 21b, or have additional resistor(s) added to increase the resistance of the peripheral branch to a predefined resistance $R_s$. The segment of wire 21a between $R_s$ and wire tester 30 is that which is tested by this invention.

Instead of connecting the noninverting input 38 of amplifier 31 to a fixed reference voltage or ground as is common in conventional systems, it is connected to a voltage source 37, which can be activated by the test control unit 39 to produce two distinct voltages, $V_{test1}$ and $V_{test2}$.

When test control unit 39 activates the voltage source 37 to provide $V_{test1}$, it measures the output of amplifier 31 and saves the value $V_{out1}$. Similarly, when it causes voltage source 37 to provide $V_{test2}$, it measures $V_{out2}$. It then computes a testgain, defined as $$\text{testgain} = \frac{V_{out2} - V_{out1}}{V_{test2} - V_{test1}}$$

In the event that wires 21a, 21b are correctly functioning, the testgain should the same as a first test limit which may be computed by a calculation unit 42 in test control device 39 as follows:

NORMAL: $TL_1 = 1 + R_{fb}/(R_{in}+R_s)$

In the event that wire 21a has a discontinuity in wire 21a, or 21b as indicated by break at node 24, the testgain is equal to a second test limit set to 1:

OPEN: $TL_2 = 1$

In the event that wire 21a has shorted to wire 21b, shown as dotted line 22, the testgain is equal to a third test limit:

SHORT: $TL_3 = 1 + R_{fb}/R_{in}$

Test control unit 39 may monitor the output $V_{out}$ to determine whether the test should be run or not. Some systems have periodic intervals when the value of $V_{out}$ is not important, or is not being utilized by subsequent processes. Furthermore, it is always the case that the dynamic range of amplifier 31 must not be exceeded for either of the two test voltages, for the test to be valid.

Test control unit 39 has a compare unit 44 which compares the measured value of testgain with the computed test limits, which may be precomputed, and makes a decision as to the status of the wires. The status is provided to local output device 25 or external output device 27 which either notifies an operator of the status, activates alarms, or takes the appropriate action in the event of a failure of wires 21a, 21b. Alternatively, the control unit 39 may provide the testgain values, or measured output of amplifier 31, to an external device for evaluation.

In an alternative embodiment, test control unit 39 may also advise other devices utilizing signal $V_{out}$ that the test is in process during the wire test, so that they may ignore $V_{out}$ or compensate $V_{out}$ for the temporary disturbance.

The values of $R_{in}$ and $R_s$ may be advantageously selected to enhance sensitivity to the expected fault mode. Small values of $R_s$ increase the difference in gain between the normal and open case; large values of $R_s$ increase the difference in gain between the normal and short case.

As an example, if $R_{in}=R_s$, and $R_{fb}=2*(R_{in}+R_s)$ so that $V_{out}/V_{sig}=-2$, the response of the circuit is:

NORMAL: $\Delta V_{out}/\Delta V_{test} = 3$

OPEN: $\Delta V_{out}/\Delta V_{test}=1$

SHORT: $\Delta V_{out}/\Delta V_{test}=4$

As noted previously, the injection of signal $V_{test1}$, $V_{test2}$ affects $V_{out}$, possibly making the output of amplifier 31 unusable for subsequent devices during testing. The present invention may be modified to perform an integrity test of wires 21a, 21b when an operational signal, $V_{sig}$, is being transmitted over wires 21a, 21b, and still provide an output signal which is not affected by the testing.

Figure 3:
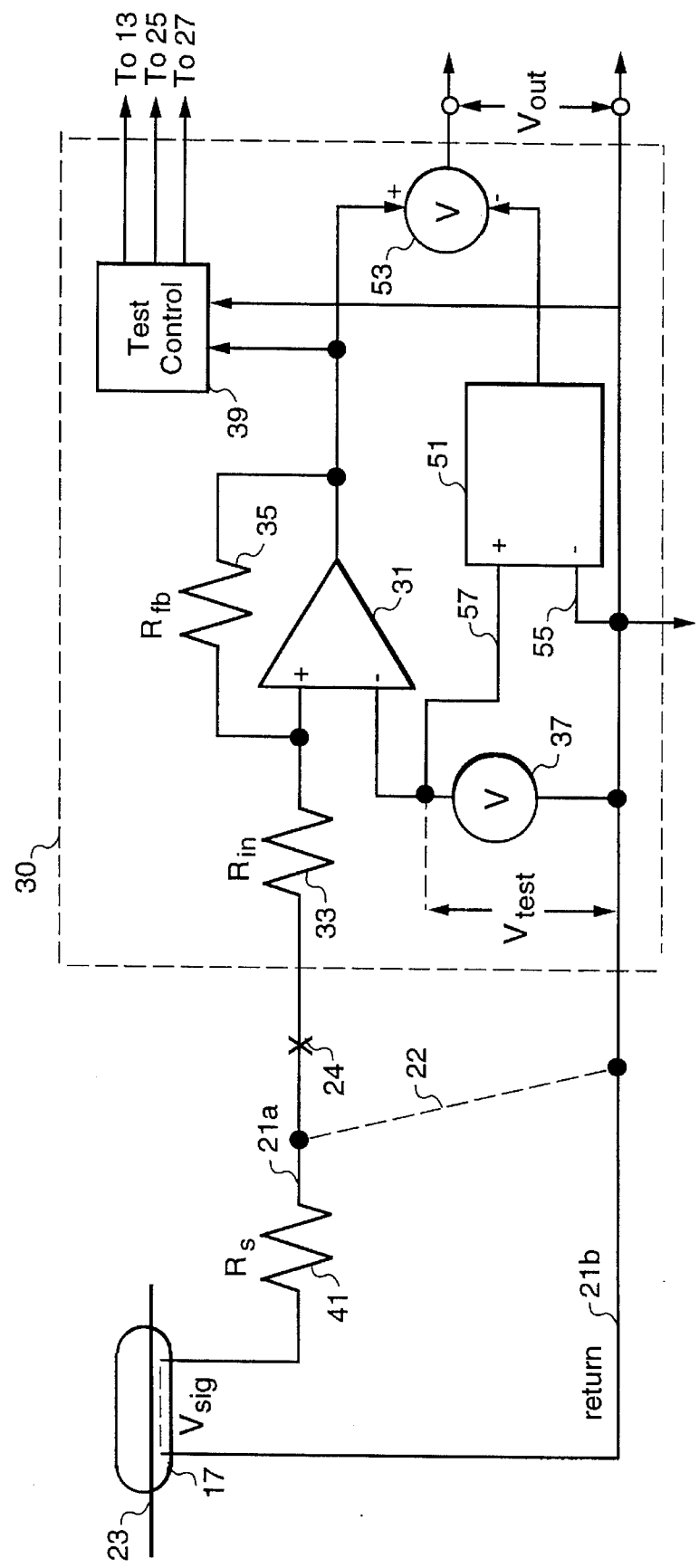
FIG. 3 is a more detailed block diagram of a second embodiment of a wire tester circuit according to the present invention.

FIG. 3 shows a simplified block diagram of a second embodiment of the present invention. An additional amplifier 51 is configured for the same gains as amplifier 31 and its associated components $R_{fb}$, $R_{in}$ and $R_s$. It is most easily implemented through identical circuitry, but its inverting input 55 is connected to the return rather than line 21a receiving a signal from current sensor 17. As mentioned previously, the amplifiers 31, 51 provide a linear combination of their inputs. Amplifier 31 provides an output resulting from $V_{sig}$ and $V_{test}$, while amplifier 51 provides an output resulting only from $V_{test}$. An additional subtractor circuit 53 removes the component due to testing such that the output $V_{out}$ suffers no disturbance when the test is run. All other circuit elements perform as described in connection with FIG. 2.

It will be clear that there is no variable quantity associated with the added amplifier 51. $V_{test1}$ and $V_{test2}$ are known or can be measured, and the gains of amplifiers 31, 51 are known or can be measured.

The introduction of $V_{test1}$, $V_{test2}$ to amplifier 31 causes an signal, in addition to the signal $V_{sig}$ intended to be provided to amplifier. This results in an output signal being the amplification of $V_{sig}$ and a perturbation signal being the amplification of $V_{test1}$, or $V_{test2}$. Amplifier 51 performs the same amplification as amplifier 31 and produces a compensation signal being substantially the same as the perturbation signal. This perturbation signal is subtracted by subtraction unit 53 to produce a signal which is free of the perturbation signal, and able to be used even while the integrity of wires 21a, 21b, amplifier 31 and associated circuitry are being tested.

Furthermore, it will be clear that while FIG. 3 suggests an analog implementation of the subtractor, that digital as implementations, either in the wire tester or in the other devices described, would be equally suitable. For example, any of the signals here may be digitally quantized and manipulated to perform the same function as described here. Knowing the amplification characteristics of amplifier 31, or the perturbation signal, the signal from amplifier 31 may be samples, digitized and corrected by subtracting a digitized representation of the perturbation signal from each sample of the output of amplifier 31 to result in a signal free of the perturbation signal.

Also, knowing the intended amplifications of amplifier 31, a digital representation of the signal provided to it may be multiplied by gain parameters and then be adjusted as described above for the perturbation signal.

It should also be clear that not only the wires 21 are being tested, but also the functionality of amplifier 31, during the conduct of the test. It is frequently important to determine the integrity of the whole signal path, even if isolation of a fault to a particular component is not possible. Thus this invention also evaluates the integrity of a receiving circuit (amplifier 31, $R_{in}$, and $R_{fb}$.)

The present invention is described in connection with a motor starter for illustrative purposes. It is to be understood that the present invention may also be employed in other applications. It is particularly useful in testing the integrity of wires of circuits which are inaccessible, such as underwater cables, underground cables, power wires and telephone wires. The present invention is also very useful for testing wires of sensor and safety-critical circuits, such as alarm systems, feedback circuits, or shut-off circuits.

While several presently preferred embodiments of the novel system have been described in detail herein, many modifications and variations will now become apparent to those skilled in the art. It is, therefore, to be understood that the appended claims are intended to cover all such modifications and variations as fall within the true spirit of the invention.

What is claimed is:

1. A device for testing integrity of a signal wire carrying a signal $V_{sig}$ and return wire serially connected with a resistance $R_s$ comprising:
   a) a first amplifier (1st amp) having an input resistance $R_{in}$, a feedback loop having a resistance $R_{fb}$, an inverting input connected to said signal wire, a noninverting input, and an output, the amplifier providing an output voltage $V_{out}$ at its output being linearly related to voltage provided to its inputs;
   b) a test voltage unit having first and second connections, capable of providing two distinct test signals $V_{test1}$, $V_{test2}$ across its connections with its first connection coupled to the 1st amp's noninverting input, and the second coupled to the return wire; and
   c) a test control unit for activating the test voltage unit to inject test signals $V_{test1}$, $V_{test2}$ into the 1st amp causing the 1st amp to create output signals $V_{out1}$, $V_{out2}$, respectively, for determining if the signal wire and return wire are shorted, if the signal wire and return wire are discontinuous from the test signals and output signals, and for indicating when the wires are shorted or discontinuous.

2. The device for testing the integrity of a signal wire carrying a signal $V_{sig}$ and a return wire of claim 1 wherein the test control unit comprises:
   a) calculation unit for
   i. calculating a first test level described by:

$TL_1=1+R_{fb}/R_{in}$ corresponding to the signal and return wires being shorted, a short circuit status,
   ii. for setting a second test level to one:

$TL_2=1$ corresponding to a break in either the signal wire or the return wire, an open circuit condition, and also
   iii. for calculating a third test level described by:

$TL_3=1+R_{fb}/(R_{in}+R_s)$ corresponding to a normal circuit status,
   iv. for calculating a testgain described by:

$$testgain = \frac{V_{out2} - V_{out1}}{V_{test2} - V_{test1}}$$

b) comparison unit coupled to the calculation unit for selecting one of the test levels based upon the testgain, and indicating the circuit status corresponding to the selected test level.

3. The device for testing the integrity of a signal wire carrying a signal $V_{sig}$ and a return wire of claim 1 further comprising:

a) a second amplifier (2nd amp) being substantially the same as the 1st amp, with its inverting input connected to a zero voltage reference, and its noninverting input coupled to the same test voltage source connection as the amplifier is coupled;

b) a summer connected to the output of the 1st amplifier, and the output of the 2nd amp for subtracting the output of the 2nd amp from the output of the 1st amp to result in a signal substantially free of any disturbances introduced by testing.

4. A device for testing integrity of a circuit having a peripheral branch with signal wire carrying a signal $V_{sig}$ and return wire serially connected with a resistance $R_s$, the signal wire connected to an inverting input of a first amplifier (1st amp) having an input resistance $R_{in}$, and a feedback loop resistance $R_{fb}$, noninverting input, and an output, the 1st amp providing an output voltage $V_{out}$ at its output being linearly related to voltage provided to its inputs, comprising:

a) a test voltage unit having first and second connections, capable of providing two distinct test signals $V_{test1}$, $V_{test2}$ across its connections with its first connection coupled to the amplifier's noninverting input, and the second coupled to the return wire; and b) a test control unit for activating the test voltage unit to inject test signals $V_{test1}$, $V_{test2}$ into the 1st amp causing the amplifier to create output signals $V_{out1}$, $V_{out2}$, respectively, for determining if the signal wire and return wire are shorted, if the signal wire and return wire are discontinuous, if the 1st amp is functioning properly from the test signals and output signals, and for indicating when the wires are shorted or discontinuous.

5. The device for testing the integrity of a circuit of claim 4 wherein the test control unit comprises:

a) calculation unit for
 i. calculating a first test level described by:

$$TL_1 = 1 + R_{fb}/R_{in}$$

corresponding to the signal and return wires being shorted, a short circuit status,
 ii. for setting a second test level to one:

$$TL_2 = 1$$

corresponding to a break in either the signal wire or the return wire, an open circuit condition, and also
 iii. for calculating a third test level described by:

$$TL_3 = 1 + R_{fb}/(R_{in} + R_s)$$

corresponding to the amplifier functioning properly and a normal circuit status,
 iv. for calculating a testgain described by:

$$\text{testgain} = \frac{V_{out2} - V_{out1}}{V_{test2} - V_{test1}} \text{ ; and}$$

b) comparison unit coupled to the calculation unit for selecting one of the test levels based upon the testgain, and indicating the circuit status corresponding to the selected test level.

6. The device for testing the integrity of a circuit of claim 4 further comprising:

a) a second amplifier (2nd amp) being substantially the same as the 1st amp, with its inverting input connected to a zero voltage reference and the return wire, and its noninverting input coupled to the same test voltage source connection as the 1st amp is coupled;

b) a summer connected to the output of the 1st amp, and the output of the 2nd amp for subtracting the output of the 2nd amp from the output of the 1st amp to result in a signal substantially free of any disturbances introduced by testing.

* * * * *